United States Patent Office 3,532,569

Patented Oct. 6, 1970

3,532,569

ALUMINUM ETCHANT AND PROCESS

James H. Gould, Kokomo, Ind., assignor to General Motors Corporation, Detroit, Mich., a corporation of Delaware No Drawing. Filed Mar. 10, 1967, Ser. No. 622,054
Int. Cl. C23f *1/00*
U.S. Cl. 156—22 3 Claims

ABSTRACT OF THE DISCLOSURE

This invention relates to an alkaline aqueous solution of a ferricyanide salt for etching aluminum. It is particularly useful for very uniformly dissolving evaporated aluminum films, such as are used in making contacts on semiconductors by photoetching techniques.

BACKGROUND OF THE INVENTION

Field of the invention

This invention relates to a chemical etchant for extremely uniformly dissolving aluminum and aluminum base alloys. It is most advantageously used in producing conductor or contact patterns, by photoetching techniques, in small electronic circuits, semiconductor devices, etc., where extremely fine detail is required.

Description of the prior art

In the electronics industry, and especially in the semiconductor industry, circuit patterns and terminal lead contact areas are conventionally made by evaporating aluminum films onto ceramic or semiconductor substrates and selectively etching away unwanted portions of the film. The selective etching involves applying a film of photosensitive resist to the aluminum film, exposing the resist to light through an appropriate negative and dissolving away unpolymerized areas of the resist to selectively bare appropriate regions of the aluminum film. A chemical etchant is then applied to the thus masked aluminum and the unprotected regions of the film are etched away. After etching, the mask is removed to yield those regions of the aluminum film which were not etched away. Conventionally, an alkali metal hydroxide, such as sodium or potassium hydroxide, is used to etch the aluminum film. While these etchants may be satisfactory for some purposes, I have found them unsatisfactory where extremely fine detail is required. They do not etch uniformly. They undercut the aluminum film, and they attack the photoresist. While these results can be tolerated in etching larger patterns, they are highly objectionable when making miniature electrical circuits and semiconductor devices. For example, when making monolithic integrated circuits, thin film devices and the like, it is extremely important that the etched aluminum film have an extremely high resolution. This is obtained by etching the aluminum film extremely uniformly, without undercutting and without attack of the photo-resist mask.

Unfortunately, the alkali metal hydroxide inherently produces a gassing at the aluminum surface, which induces nonuniform wetting; hence, nonuniform etching of the aluminum. Moreover, where extremely narrow conductors are being produced, undercutting of the conductor can be a serious problem. Further, gassing at the aluminum surface requires removal of the workpiece from the etchant, rinsing and re-immersion one or more times to complete the etching. This re-immersion technique apparently accelerates deterioration of the photo-resist maskant.

SUMMARY OF THE INVENTION

In essence, applicant's invention involves an improved etchant for aluminum that avoids the aforementioned problems associated with conventional etchants. Applicant's etchant is an alkaline aqueous solution of an alkali metal ferricyanide and/or ammonium ferricyanide etchant. By the term aluminum, I also mean to include alloys thereof.

It is an object of applicant's invention to provide a new and improved etchant for aluminum which does not generate gas, does not undercut films, produces effective wetting and produces extremely uniform etching.

It is a further object of applicant's invention to provide an etchant for evaporated aluminum films, such as are used in making conductor patterns and terminal lead contact areas on electronic devices, which has extremely high resolution and does not deleteriously affect either the adherence of the aluminum film or attack photoresist maskants.

A further object of the invention is to provide an improved process for etching aluminum, particularly evaporated aluminum films, which does not require removal of the aluminum article from the etching bath and subsequent re-immersion to complete etching.

DESCRIPTION OF THE PREFERRED EMBODIMENTS

As previously indicated, this invention involves an alkaline aqueous solution of an alkali metal ferricyanide and/or ammonium ferricyanide. The ferricyanide ion apparently is the principal agent which produces the unexpected benefits achievable with my etchant. Even small but effective amounts of the ferricyanide salt are sufficient to provide noticeable benefits. However, I prefer to use at least 5 grams per liter of the ferricyanide salt and in most cases best resolution is obtainable with more than 25 grams per liter up to saturation.

Etching resolutions containing 1 gram potassium hydroxide, 88 grams ferricyanide and 800 milliliters of water provide excellent resolution in etching films for finely detailed integrated circuits and thin film circuits without involving extended etch times. Etching time for this solution can be diminished by increasing the potassium hydroxide concentration up to 10 grams. However, there is an attendant reduction in resolution which may be unsatisfactory where extreme detail is required.

The alkali used in the etchant is preferably an alkali metal hydroxide, such as sodium hydroxide or potassium hydroxide. Increasing concentrations of alkali increase the rate of etching. However, only small concentrations of the alkali should be used, since increased concentrations will also produce gassing at the aluminum surface and nonuniform etching. The alkali concentration should not exceed about 25 grams per liter. In general, as the ferricyanide to alkali molar ratio increases, etching uniformity and resolution increases. Accordingly, while increased concentrations of alkali increase etching rate, they adversely affect resolution. A 1:2 molar ratio of ferricyanide salt to alkali is the maximum amount of alkali that can be tolerated and still obtain acceptable results. Very good resolution in etched films is obtained with a 20:1 molar ratio of ferricyanide salt to alkali but etching rate is rather slow. In actual commercial production the selection of the preferred molar ratio will be dependent upon the uniformity of etching of resolution required, as opposed to the maximum etch time which can be tolerated.

The following serves as a specific example of the use of my invention in making a thin film circuit. A glass substrate is first cleaned and then placed in a vacuum chamber wherein an aluminum film is evaporated in the normal and accepted manner onto the entire surface of the substrate. An aluminum coating of about 1 micron is usually produced by flash evaporation under a pressure of about $1 \times 10^{-6}$ torr. Vacuum evaporated films for thin film circuits, semiconductor devices and the like, are generally ½ to 10 microns in thickness.

After evaporation, a photo-resist coating is applied to the aluminum film and exposed to light through an appropriate negative of the circuit pattern desired to polymerize selected regions. The unpolymerized regions of the photo-resist coating are subsequently dissolved away to bare the underlying aluminum film. A short baking period usually follows to cure the remaining coating which masks the circuit pattern desired.

The thus prepared coated substrate is then immersed in a room temperature solution containing 5 grams of potassium hydroxide, 88 grams of potassium ferricyanide and 800 milliliters of water. It is allowed to remain immersed in the alkaline ferricyanide solution for a sufficient duration to etch completely through the exposed aluminum film. For film thicknesses of about 1 micron, an etch time of about 3 minutes is required.

After the exposed aluminum film on the coated substrate has been completely etched away, the substrate is removed from the solution and rinsed in deionized water to remove any residual solution clinging to it.

Thereafter, the photo-resist mask is removed by immersing the substrate in an appropriate solvent, such as methyl ethyl ketone, to yield the finished circuit pattern. Thin film capacitors and resistors can then be applied in the usual fashion, as by sputtering or the like, and capacitor contacts, if needed, formed by evaporation through a mask, thus completing the circuits.

I prefer to use my etchant at room temperature. Increased temperatures tend to increase etch rate but if increased too high can diminish resolution of the boundaries on the aluminum film. Lower temperatures do not normally provide any significant increase in resolution but do reduce etch rate.

It is to be understood that although this invention has been described in connection with certain specific examples thereof, no limitation is intended thereby except as defined in the appended claims.

I claim:

1. The method which comprises evaporating a film of aluminum onto a surface of a semiconductor, and etching selected portions of said film with an aqueous solution comprising at least about 5 grams up to saturation of a ferricyanide salt selected from the group consisting of alkali metal ferricyanide and ammonium ferricyanide and from $\frac{1}{20}$ to 2 moles per liter of an alkali metal hydroxide for each mole per liter of said ferricyanide salt.

2. The method which comprises evaporating a film of aluminum onto a surface of a semiconductor, masking selected portions of said aluminum film, immersing said masked film in an aqueous solution consisting essentially of from about 20 grams per liter to saturation of sodium ferricyanide and from $\frac{1}{20}$ to 2 moles per liter of an alkali metal hydroxide selected from the group consisting of sodium hydroxide and potassium hydroxide for each mole of ferricyanide.

3. The method which comprises evaporating a film of aluminum onto a surface of a semiconductor, masking selected portions of said aluminum film, immersing said masked film in an aqueous solution consisting essentially of from about 20 grams per liter to saturation of potassium ferricyanide and from $\frac{1}{20}$ to 2 moles per liter of an alkali metal hydroxide selected from the group consisting of sodium hydroxide and potassium hydroxide for each mole of ferricyanide.

References Cited

UNITED STATES PATENTS 3,098,043 7/1963 Wendell ----------- 252—79.5

JACOB H. STEINBERG, Primary Examiner

U.S. Cl. X.R.

252—79.5